(12) United States Patent
Hoehn et al.

(10) Patent No.: US 6,207,732 B1
(45) Date of Patent: Mar. 27, 2001

(54) HEAT-SETTING SINGLE-COMPONENT LVA (LOW-VISCOSITY ADHESIVE) SYSTEM FOR BONDING IN THE MICRO-RANGE

(75) Inventors: Klaus Hoehn, Taufkirchen; Heiner Bayer, Olching; Martin Honsberg-Riedl, Reichenhall, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/230,075

(22) PCT Filed: Jul. 17, 1997

(86) PCT No.: PCT/DE97/01505

§ 371 Date: Jan. 19, 1999

§ 102(e) Date: Jan. 19, 1999

(87) PCT Pub. No.: WO98/03606

PCT Pub. Date: Jan. 29, 1998

(30) Foreign Application Priority Data

Jul. 18, 1996 (DE) .............................................. 196 29 082

(51) Int. Cl.$^7$ ....................................................... C08L 3/02
(52) U.S. Cl. .......................... 523/447; 523/456; 523/466; 528/90
(58) Field of Search ................................... 523/466, 447, 523/456; 528/90

(56) References Cited

U.S. PATENT DOCUMENTS 4,300,002 * 11/1981 Shibatani et al. ..................... 568/817
4,480,059 10/1984 Dudgeon .

FOREIGN PATENT DOCUMENTS

| 30 08 497 | 9/1980 | (DE) . |
| 0 245 018 | 11/1987 | (EP) . |
| 0527107 * | 2/1993 | (EP) . |
| 0 527 107 | 2/1993 | (EP) . |
| 03170576 * | 7/1991 | (JP) . |

OTHER PUBLICATIONS

CAS Registry Report for RU 25085–98–7, 1967.*

* cited by examiner

Primary Examiner—Robert Dawson
Assistant Examiner—D. Aylward
(74) Attorney, Agent, or Firm—Schiff Hardin & Waite

(57) ABSTRACT

The invention relates to a single-component adhesive system that consists at least of a casting resin, in particular of an epoxy casting resin, and a multivalent alcohol. The low-viscosity adhesive system can be microdosed, is stable in storage, is completely hardenable and is suitable for applications in which the dimensional tolerances are in the $\mu$m and sub-$\mu$m region.

16 Claims, No Drawings

HEAT-SETTING SINGLE-COMPONENT LVA (LOW-VISCOSITY ADHESIVE) SYSTEM FOR BONDING IN THE MICRO-RANGE

BACKGROUND OF THE INVENTION

The invention relates to a casting resin system that is suitable for the formation of glued bonds having dimensional tolerances in the micrometer and sub-micrometer ("$\mu$m and sub-$\mu$m") region.

For micro-glued bonds, adhesive systems are known that consist in general of a resin component and a hardener component. These two-component adhesive systems present problems in the small quantities in which they are required for glued bonds in the micro-region in particular in the exact dosing, mixing and homogenization of the individual components immediately before application. Another disadvantage is that they standardly have an excessively high viscosity, and are thus only at higher temperatures (approx. 70° C.) liquid enough that the application of the adhesive for the microdosing—known as LVA (low-viscosity adhesives) adhesives—can take place. The known two-component systems have the further disadvantage that due to their non-homogeneities in thin layers or small drops they harden only incompletely, even in an inert gas or nitrogen atmosphere. All these factors have the result that up to now it has not been possible to realize, with the required reproducible quality, compounds that are technically acceptable for commercial manufacturing with respect to bond strength and dimensional tolerance in the $\mu$m and sub-$\mu$m region (smaller than 1 $\mu$m).

There is thus a need for an adhesive system that enables an efficient, automated, reliable, low-cost bonding technique for low-cost electronics and optoelectronics systems. In particular, there is a need for adhesive systems for glued bonding in the $\mu$m and sub-$\mu$m region that can be reliably dosed and hardened in extremely thin layers or small drops. The mentioned dimensions should thereby also be maintained after hardening.

SUMMARY OF THE INVENTION

An object of the present invention is thus to provide an adhesive system that comprises no non-homogeneities even in small quantities, and is suited for micro-quantity dosing. In addition, an object of the present invention is to provide an adhesive system that hardens completely in thin layers. By this means, the reliability and strength of the glued bond is increased, and undesired outgasings of the completed glued bond can be reduced. Finally, in comparison with known systems the inventive adhesive system, is intended to exhibit lower viscosity and well-balanced flow properties. Finally, the service life of the adhesive systems should permit the addition of the individual components with dimensional tolerances in the micro-region and smaller.

These objects are achieved by means of the inventive adhesive system. The subject matter of the present invention is a thermally hardenable single-component casting resin system. The casting resin system includes the following components:

60–98% weight percent of a casting resin

2–30 weight percent of an alcohol or a sugar, 0.2–2.0 weight percent of a thermal initiator, 0.2–2.0 weight percent of a bonding agent and/or 0–3.0 weight percent of a flow improver and/or 0–4 weight percent of a thixotropic agent and/or of a flow modifier.

In addition, the present invention provides the use of such a casting resin for the formation of glued bonds with dimensional tolerances in the $\mu$m and sub-$\mu$m region. Additional objects and advantages of the present invention are described in, and will be apparent from, the detailed description of the presently preferred embodiments.

DETAILED DESCRIPTION OF THE PRESENTLY PREFERRED EMBODIMENTS

The present invention provides an adhesive system suitable for the formation of glued-bonds in the $\mu$m and sub-$\mu$m region. The adhesive system can be microdosed, is stable in storage conditions, can be hardened completely, and is suitable for applications in which the dimensional tolerances are in the $\mu$m and sub-$\mu$m region.

The single-component adhesive system includes at least a casting resin and an alcohol or a sugar. In a preferred embodiment, the casting resin is an epoxy casting resin and the alcohol is a multivalent alcohol. In addition, the adhesive system preferably includes a thermal initiator, a bonding agent, a flow improver, a thixotropic agent and a flow modifier. Still further, the adhesive of the present invention can also include known additives that thereby provide additional characteristics to the adhesive.

In the present invention, "casting resin" is understood to mean thermally hardenable resin systems and reaction resins that are of such low viscosity that by means of casting they can be brought into a corresponding shape in which they can then be hardened thermally, i.e. by means of temperature increase with the presence of suitable additives i.e., (initiators, accelerators, and other components). According to the invention, a preferred casting resin is epoxy casting resin. In the inventive formulation, the casting resin is contained in a quantity of 60–98 weight percent, advantageously in a quantity of 75 to 95 weight percent, preferably between 80 and 95 weight percent, and particularly preferably in the range from 85 to 93 weight percent.

As an "epoxy casting resin," cycloaliphatic epoxy resins can be used, such as the resin CY177 available from Ciba Geigy (a 3,4-epoxycyclohexylmethyl)-adipate) or the resin CY179, likewise available from Ciba Geigy (a 3,4-epoxycyclohexylmethyl-3',4'-epoxycyclohexane carboxylate). In addition, linear aliphatic epoxy resins, e.g. epoxied polybutadiene or epoxied soybean oil, are suitable for use in the present invention. Other cationically hardening resins, such as vinyl ether or vinyl aromates, are likewise suitable. In addition, epoxy resins of the glycidylether type are suitable. The following can serve as a basis for the glycidylether: bisphenols, (e.g. bisphenol A), di- or polyhydroxyaromates (e.g. resorcin), polyarylalkyls with phenolic OH groups, novolaks, polyalkylene glycols or also multiple alcohols (e.g. glycerine or pentaerythritol). In addition, glycidylether ester-type compounds are suitable (e.g. parahydroxybenzoic acid-glycidylether ester); pure glycidyl ester of multiple carbon acids with aliphatic or aromatic core (e.g. hexahydrophthalic acid or phthalic acid).

According to the invention, alcohols with 1–15 hydroxy groups or sugar are used as "alcohol or sugars." Preferably, alcohols with 1 to 5 hydroxy groups are used. The skeletal structure of the alcohol or sugar can thereby vary arbitrarily. It can be aliphatic, cyclic or bicyclic. It can consist only of single bonds or also of multiple bonds, and can also be an aromatic system. Among others, the TCD alcohol DM available from the Hoechst company is preferably used, which is a 3(4),8(9)bis(hydroxymethyl)tricyclo[$5.2.1.0^{2,6}$] decane. The (preferably multivalent) alcohol is contained in the adhesive formulation with a mass portion between 2 and 30 weight percent. It preferably has a mass portion between 2.5 and 20 weight percent, particularly preferably a portion between 4.5 and 12 weight percent.

As a thermal initiator, all standard initiators that harden according to a cationic mechanism, e.g. onium salts, can be used. Here, S-benzylthiolaniumhexafluoroantimonate, available from the Aldrich company, is preferably used.

As a bonding agent, A187 available from the Hüls company is used, which is a 3-glycidyloxypropyltrimethoxysilane.

As a flow improver, Modaflow available from (Monsanto company) can be used. As flow modifiers or thixotropic agents the commercially available aersol types available from the Degussa company can, for example, be used.

Besides the components already stated, further known additives can also be contained in the inventive adhesive system. As a result, the adhesive systems also receive additional characteristics, such as a particular color or transparency, as well as flame retardance or heat resistance. Additives in this sense can thus be, for example, dyes, pigments, flow modifiers, general stabilizers, fire protection agents, or mineral or other filling materials. It is thereby almost always possible to achieve particular characteristics by means of additives, e.g. selective absorption or transparency by the addition of a dye.

The manufacturing of the adhesive system takes place as in comparable systems. The formulation components, such as the epoxy resin, the multivalent alcohol, the thermal initiator, the bonding agent and, if warranted, a flow improver are mixed uniformly with one another. In an embodiment, such mixing can also occur at increased temperatures and with solvents that can be removed again. For the manufacture of the adhesive system, it is thus possible to make use of standard methods known to be reliable from the prior art.

EXAMPLES

By way of example, and not limitation, the invention is now explained in more detail on the basis of an embodiment. Table 1 shows the formulation components of a representative example of an adhesive system made pursuant to the present invention.

TABLE 1

Components and chemical designation of a representative formulation

| Component (reference source), chemical designation | Portion [mass portion] |
|---|---|
| Resin: | |
| CY177 (Ciba Geigy), bis(3,4-epoxycyclohexylmethyl)adipate | 100 |
| Multivalent alcohol: | |
| TCD alcohol DM (Hoechst), 3(4),8(9)-bis(hydroxymethyl)-tricyclo [5.2.1.0$^{2,6}$]decane | 10 |
| Thermal initiator: | |
| S-benzylthiolaniumhexafluoroantimonate (Aldrich) | 1 |
| Bonding agent: | |
| A187 (Hüls) 3-glycidyloxypropyltrimethoxysilane | 0.5 |

Table 2 summarizes selected material characteristics of the formulation depicted in the above example.

TABLE 2

Characteristic data for processing, as well as selected material characteristics of the crosslinked adhesive

| Hardening | 1 h 120° C. (complete hardening) |
|---|---|
| Resin characteristics: | |
| Viscosity η [mPas] | |
| Room temperature | 880 |
| 60° C. | 120 |
| 80° C. | 80 |
| Reactivity: | |
| 2η (80° C.) [min] | 55 |
| DSC (10 K/min): | |
| T(Onset) [° C.] | 96 |
| T(min) [° C.] | 130 |
| Heat tone ΔH$_R$ [-J/g] | 415 |
| Material characteristics: | |
| Glass transition temperature [° C.] (DSC, 10 K/min) | 68 |
| Dynamic-mechanical analysis (Tensile mode, 3 K/min) | |
| Modulus of elasticity (20° C.) [N/mm$^2$] | 2,400 |
| α(-60 to 40° C.) [ppm/K] | 96 |
| α transition [° C.] | 63 |
| β transition [° C.] | -64 |
| Shore hardness | D 81 |
| Thermal stability: | |
| TG/DTA (10 K/min), N$_2$) | |
| 5% mass loss [° C.] | 350.4 |
| DTG(max) [° C.] | 413.4 |
| Rate of decomposition [%/min] | 22.7 |

Table 3 shows investigations for the storability of the formulations. 2 months was determined as the observation time period, and during the refrigeration storage (5–8° C.) no incompatibilities or separations occurred, such as for example crystallization out of the thermal initiator.

TABLE 3

Viscosity characteristic η(t) at various storage temperatures

| Storage time [d] | at room temperature η(60° C.) [mPas] | at 7° C. η(60° C.) [mPas] |
|---|---|---|
| 0 | 120 | 120 |
| 60 | 2,200 | 120 |

With the inventive adhesive system, an automated and reliable micro-gluing of electronic and optoelectronic components is possible in the μm and sub-μm region. The inventive single-component epoxy casting resin does not harden immediately, so that the addition of the individual components is permitted up until the final fixing. The epoxy resin components, as well as the overall adhesive system, is sufficiently low in viscosity to be used in micro-gluings. Finally, with the alcohol or sugar, in particular with a multivalent alcohol, the runoff, wetting and flow characteristics of the adhesive system, as well as the mechanical behavior of the adhesive bond, can be set.

The adhesive system can be dosed unproblematically in micro-quantities, and can be further optimized with respect to runoff, wetting and flow behavior by means of the addition of flow improvers. By means of heat charging, i.e. local heating or heating of the parts to be connected, the adhesive system quickly cross-links to form a homogenous adhesive bond.

The disadvantages mentioned above of the known two-component adhesive formulations for micro-connection technology are thereby overcome. In particular, the dosability and the dosage precision are improved, incomplete mixing and mixing errors are avoided, and viscosity is lowered.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

What is claimed is:

1. A thermally hardenable single-component adhesive system comprising:
   60 to 98 weight percent of a casting resin;
   2 to 30 weight percent of an alcohol or a sugar;
   0.2 to 2.0 weight percent of a thermal initiator selected from a group consisting of onium salt and S-benzylthiolaniumhexafluoroantimonate;
   0.2 to 2.0 weight percent of a bonding agent;
   0 to 3.0 weight percent of a flow improver;
   0 to 4.0 weight percent of a thixotropic agent; and
   0 to 4.0 weight percent of a flow modifier.

2. The adhesive system of claim 1 wherein the casting resin is an epoxy casting resin.

3. The adhesive system of claim 2 wherein the epoxy casting resin is a bis(3,4-epoxycyclohexylmethyl) adipate.

4. The adhesive system of claim 1 wherein the alcohol is a polyhydroxy alcohol.

5. The adhesive system of claim 1 wherein the polyhydroxy alcohol is 3(4),8(9)-bis(hydroxymethyl)tricyclo[5.2.1.0$^{2,6}$]decane.

6. The adhesive system of claim 1 further comprising an additive selected from the group consisting of dyes, pigments, flow modifiers, general stabilizers, fire protection agents, and mineral or other filling materials.

7. A thermally hardenable single-component adhesive system comprising:
   85 to 93 weight percent of an epoxy casting resin;
   4.5 to 12 weight percent of a polyhydroxy alcohol;
   0.7 to 1.0 weight percent of a thermal initiator selected from a group consisting of onium salt and S-benzylthiolaniumhexafluoroantimonate;
   0.3 to 0.6 weight percent of a bonding agent;
   0 to 1.5 weight percent of a flow improver;
   0 to 2.0 weight percent of a thixotropic agent; and
   0 to 2.0 weight percent of a flow modifier.

8. The adhesive system of claim 7 wherein the epoxy casting resin is a bis(3,4-epoxycyclohexylmethyl) adipate.

9. The adhesive system of claim 7 wherein the polyhydroxy alcohol is 3(4),8(9)-bis(hydroxymethyl)tricyclo[5.2.1.0$^{2,6}$]decane.

10. A method for forming glued bonds with dimensional tolerances in the micrometer and sub-micrometer region, the method comprising the steps of:
    providing a thermally hardenable single-component adhesive system comprising:
        60 to 98 weight percent of a casting resin;
        2 to 30 weight percent of an alcohol or a sugar;
        0.2 to 2.0 weight percent of a thermal initiator selected from a group consisting of S-benzylthiolaniumhexafluoroantimonate and onium salt;
        0.2 to 2.0 weight percent of a bonding agent;
        0 to 3.0 weight percent of a flow improver;
        0 to 4.0 weight percent of a thixotropic agent; and
        0 to 4.0 weight percent of a flow modifier;
    dosing the adhesive system onto components to be connected; and
    thermally hardening the adhesive system.

11. The method claim 10 wherein the casting resin is an epoxy casting resin.

12. The method of claim 11 wherein the epoxy casting resin is a bis(3,4-epoxycyclohexylmethyl) adipate.

13. The method of claim 10 wherein the alcohol is a polyhydroxy alcohol.

14. The method of claim 13 wherein the polyhydroxy alcohol is 3(4),8(9)-bis(hydroxymethyl)tricyclo[5.2.1.0$^{2,6}$]decane.

15. The method of claim 10 wherein the components are electronic or optoelectronic components.

16. The method of claim 10 wherein the adhesive system comprises:
    85 to 93 weight percent of an epoxy casting resin;
    4.5 to 12 weight percent of a polyhydroxy alcohol;
    0.7 to 1.0 weight percent of a thermal initiator;
    0.3 to 0.6 weight percent of a bonding agent;
    0 to 1.5 weight percent of a flow improver;
    0 to 2.0 weight percent of a thixotropic agent; and
    0 to 2.0 weight percent of a flow modifier.

* * * * *